US009532478B1

(12) United States Patent
Good et al.

(10) Patent No.: US 9,532,478 B1
(45) Date of Patent: *Dec. 27, 2016

(54) STRENGTHENING ELECTRONIC EQUIPMENT

(71) Applicant: International Business Machines Corporation, Armonk, NY (US)

(72) Inventors: Michael S. Good, Fountain, MN (US); John R. Harris, Houston, TX (US); Ray C. Laning, Kasson, MN (US); Curtis E. Larsen, Eden Valley, MN (US); Mark A. Sandusky, Honolulu, HI (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/982,620

(22) Filed: Dec. 29, 2015

Related U.S. Application Data

(63) Continuation of application No. 14/865,294, filed on Sep. 25, 2015.

(51) Int. Cl.
*A47B 81/00* (2006.01)
*H05K 7/14* (2006.01)
*F16B 5/06* (2006.01)

(52) U.S. Cl.
CPC ........... *H05K 7/1401* (2013.01); *F16B 5/0607* (2013.01)

(58) Field of Classification Search
CPC ...................................................... G06F 1/181
USPC ......... 312/223.1, 223.2; 361/679.33, 679.37, 361/679.39
See application file for complete search history.

(56) References Cited

U.S. PATENT DOCUMENTS

| 4,688,131 | A  | * | 8/1987  | Noda ................... G11B 17/02 360/137 |
| 7,054,144 | B2 | * | 5/2006  | Heistand, II ............ G06F 1/181 312/223.1 |
| 7,265,968 | B2 |   | 9/2007  | Champion et al. |
| 7,280,352 | B2 | * | 10/2007 | Wilson ................... G06F 1/184 312/223.1 |
| 7,448,702 | B2 |   | 11/2008 | Chen et al. |

(Continued)

OTHER PUBLICATIONS

Good et al., "Strengthening Electronic Equipment", U.S. Appl. No. 14/865,294, filed Sep. 25, 2015, pp. 1-22.

(Continued)

*Primary Examiner* — Matthew Ing
(74) *Attorney, Agent, or Firm* — Steven F. McDaniel

(57) ABSTRACT

A system includes an equipment case configured to hold equipment, a strengthening bracket, and one or more releasable couplers physically coupled to the equipment case and the strengthening bracket. The releasable couplers may be configured to release the strengthening bracket from the equipment case without requiring a tool. In some embodiments, the strengthening bracket comprises a first end and a second end, and one of the releasable couplers are coupled to each end of the strengthening bracket. In some embodiments, the releasable couplers each comprise a flexing member and a protrusion member coupled to the flexing member and the first end and the second end of the strengthening bracket each comprise a slot for receiving the protrusion member of a corresponding coupling member. A corresponding method includes coupling the strengthening bracket to the equipment case with the at least one releasable coupler.

1 Claim, 5 Drawing Sheets

(56) References Cited

U.S. PATENT DOCUMENTS

| | | |
|---|---|---|
| 7,483,264 B2 | 1/2009 | Chen et al. |
| 7,525,797 B2 | 4/2009 | Coglitore et al. |
| 7,542,281 B2 | 6/2009 | Liang et al. |
| 8,146,756 B2 | 4/2012 | Brock et al. |
| 8,950,830 B2 | 2/2015 | Chen et al. |
| 2012/0274190 A1 | 11/2012 | Qin et al. |

OTHER PUBLICATIONS

IBM Appendix P, list of patents and patent applications treated as related, May 18, 2016, 2 pages.

* cited by examiner

STRENGTHENING ELECTRONIC EQUIPMENT

BACKGROUND OF THE INVENTION

The present invention relates generally to electronic equipment and specifically to rack mountable electronic equipment.

Electronic equipment such as computers, servers, storage devices, storage arrays, audio equipment, and video equipment are often rack mountable into a rack mount housing in order to facilitate orderly installation of the equipment in a room or facility that is dedicated to the operation and storage of such equipment. Examples include datacenters, control rooms, electronic closets, and the like. In some cases, equipment is pre-mounted on racks in the rack mount housing previous to shipping to, and installation at, a customer site.

SUMMARY

A system includes an equipment case configured to hold equipment, a strengthening bracket, and one or more releasable couplers physically coupled to the equipment case and the strengthening bracket. The releasable couplers may be configured to release the strengthening bracket from the equipment case without requiring a tool. In some embodiments, the strengthening bracket comprises a first end and a second end and one of the releasable couplers are coupled to each end of the strengthening bracket. In some embodiments, the releasable couplers each comprise a flexing member and a protrusion member coupled to the flexing member and the first end and the second end of the strengthening bracket each comprise a slot for receiving the protrusion member of a corresponding coupling member. A corresponding method includes coupling the strengthening bracket to the equipment case with the at least one releasable coupler.

DETAILED DESCRIPTION

The embodiments disclosed herein strengthen equipment during transport and installation while retaining the serviceability of the equipment after installation.

As used herein "Rack mount housings," refers to the relatively large outer housings that include rack mount hardware for rack mounting one, or more, "pieces of equipment" (also sometimes herein called "components"). Typically each piece of equipment will have its own housing, which can be mounted within the larger housing of the rack mount housing. For the sake of clarity, as used herein: (i) the terms "case" or "casing" refers to the housing portion of a piece of equipment; and (ii) the term "housing" will refer to the larger housing in which one, or more, pieces of equipment can be installed.

Some systems integrators and equipment vendors have elected to pre-mount equipment within racks previous to transport and installation within a customer's facility. However, the equipment cases provided by equipment manufacturers are typically not engineered to withstand the shocks and stresses associated with shipping and installation— particularly when mounted in a rack. For example, the ends of an equipment case (that is the left and right sides when facing the rack mounted component) may be fixed to a rack while the middle of the case may be free to flex and/or oscillate. Consequently, the jolts and jars associated with transport may impose forces on the equipment case that are different from, and beyond those, associated with normal equipment operation. As a result, some equipment may arrive at the customer's facility in an inoperable state resulting in increased delays and costs for systems integrators, equipment vendors, and customers. The embodiments disclosed herein address at least some of these issues.

Figure 1A:
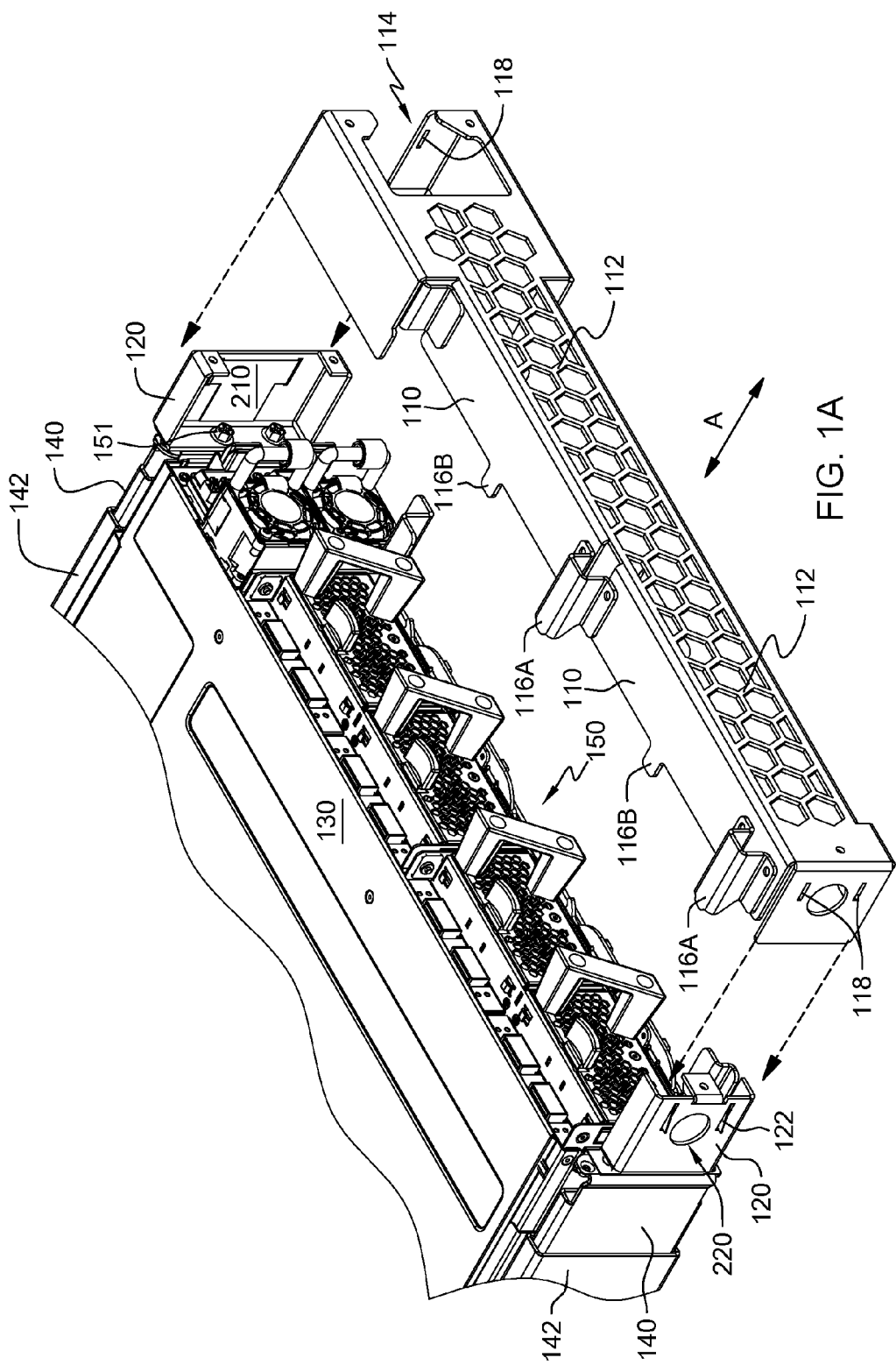
FIGS. 1A and 1B are perspective view illustrations depicting one example of an equipment strengthening system in accordance with one or more embodiments disclosed herein.
Figure 1B:
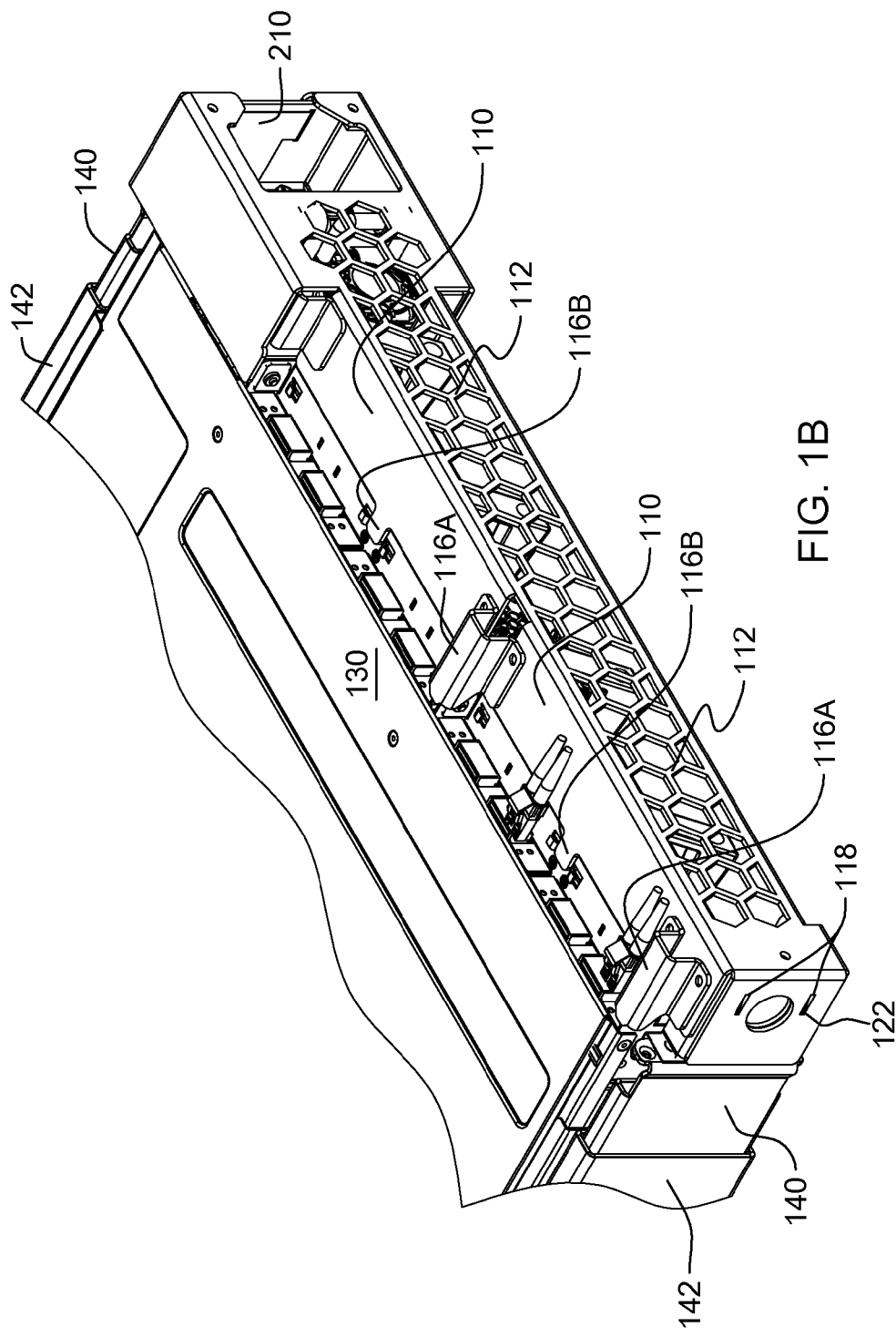

For example, FIGS. 1A and 1B are perspective view illustrations depicting one example of an equipment strengthening system 100 in accordance with one or more embodiments of the present invention. As depicted, the equipment strengthening system 100 includes a strengthening bracket 110, a pair of releasable couplers 120, an equipment case 130, and a pair of slideout arms 140. The equipment strengthening system 100 effectively strengthens equipment while enabling tool-less removal of the strengthening bracket 110 in order to service the equipment.

As shown in FIG. 1A, the depicted strengthening bracket 110 has a concave, box-like shape that allows space for various piece parts extending rearwardly from the back end of server 150 (note: equipment case 130 encloses, and forms a part of server 150). The ends of the strengthening bracket 110 are C-shaped in order to fit over the releasable couplers 120 and latch into place, as will be explained in more detail, below. The depicted strengthening bracket 110 includes a meshed panel 112 than facilitates airflow to the equipment within the equipment case 130. In the depicted embodiment, the meshed panel 112 comprises a metal material that has a hexagonal honeycomb pattern formed therein that provides a high strength-to-weight ratio.

The depicted strengthening bracket 110 also includes one or more mating elements 116 (i.e., 116A and 116B) that facilitate mating the strengthening bracket 110 to the equipment case 130 (or equipment encased therein). In the depicted embodiment, the mating elements 116A are U-shaped brackets that each have a sloped end that vertically guides the depicted strengthening bracket 110 into place relative to the equipment case 130. In contrast, the mating elements 116B are rounded tabs that mate with slots within the equipment case 130 (or equipment encased therein) and horizontally guide the depicted strengthening bracket 110 into place relative to the equipment case 130 (or equipment encased therein).

The equipment case 130 encases electronic equipment, or the like, and protects the equipment. In the depicted embodiment, two slideout arms 140 are fixedly mounted, respectively to the right and left hand sides of equipment case 130. The slideout arms slidably engage with slideout arm engagement hardware 142 of a rack mount housing (not much shown in the drawings) so that the slideout arms, the equipment case and the server can slide, in the direction of double arrow A, as a unit with respect to the rack mount housing in which they reside. This arrangement enables service personnel to slide the equipment case between an operational position (not shown) and a service position. In the depicted embodiment, each of the releasable couplers 120 physically couple the strengthening bracket 110 to the equipment case 130 via the slideout arms 140 and fasteners 151. In other embodiments, the releasable couplers 120 are directly coupled to the equipment case 130.

Figure 3:
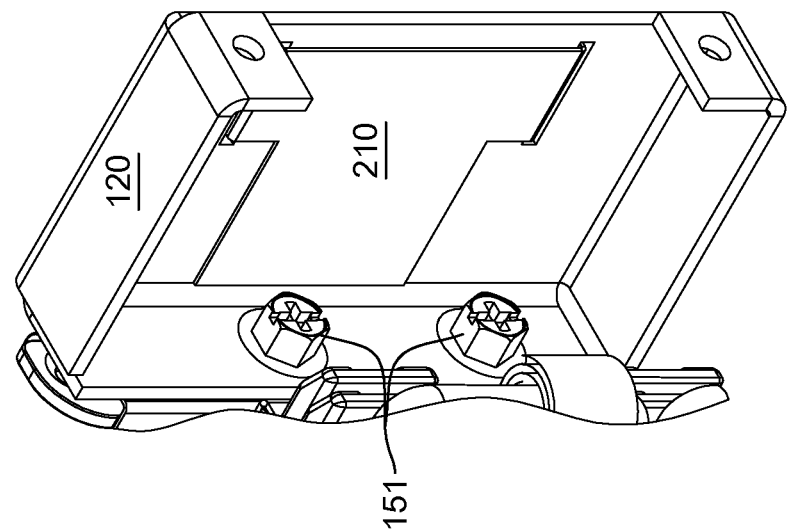
FIGS. 2 and 3 are perspective view illustrations depicting one example of a releasable coupler, included in the embodiment of FIGS. 1A and 1B, and in accordance with one or more embodiments disclosed herein.
Figure 2:
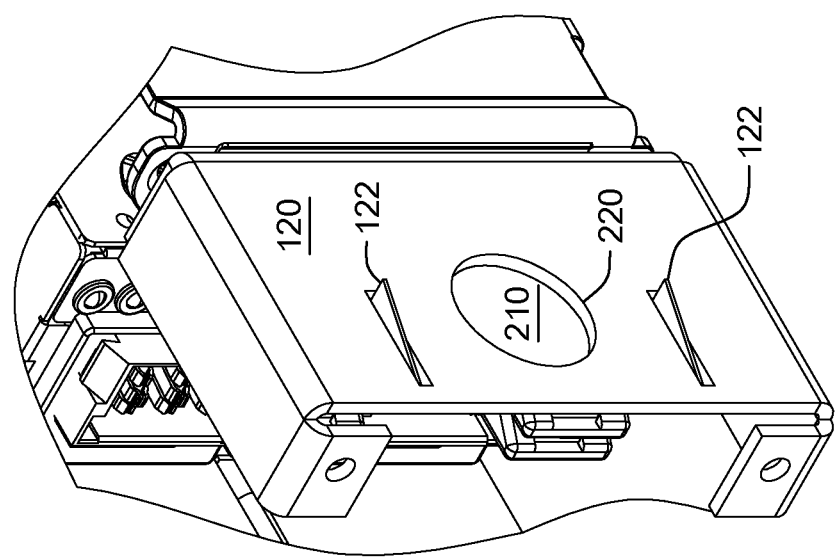

FIGS. 2 and 3 are perspective view illustrations depicting one example of the releasable couplers 120 in greater detail. Referring now to FIGS. 2 and 3, while continuing to refer to FIG. 1, each of the releasable couplers 120 have a press-in cantilever spring latch mechanism provided with a flexing member 210 and one or more protrusions 122 (attached to the flexing member 210) that mate with slots 118 within the strengthening bracket 110. In the depicted embodiment, the flexing member 210 is a cantilevered plate that is attached to the releasable coupler at the edge of the cantilevered plate that is closest to the equipment case 130.

The depicted strengthening bracket 110 and the releasable couplers 120 are provided with release apertures 220 that enable a user to press (e.g., with a finger) against the flexing member 210 and move the protrusions 122 out of the slots 118 and thereby release the releasable coupler 120. Note that no tool is needed to effect the release in this embodiment. Once released, the strengthening bracket 110 may be removed to facilitate access to the portion of the equipment that was covered by the strengthening bracket 110. Subsequently, the strengthening bracket 110 may be pushed into place over the releasable couplers 120 and guided into position by the mating elements 116. In response thereto, the protrusions 122 may snap into place within the slots 118 and thereby couple the strengthening bracket 110 to equipment case 130 of server 150.

Figure 4:
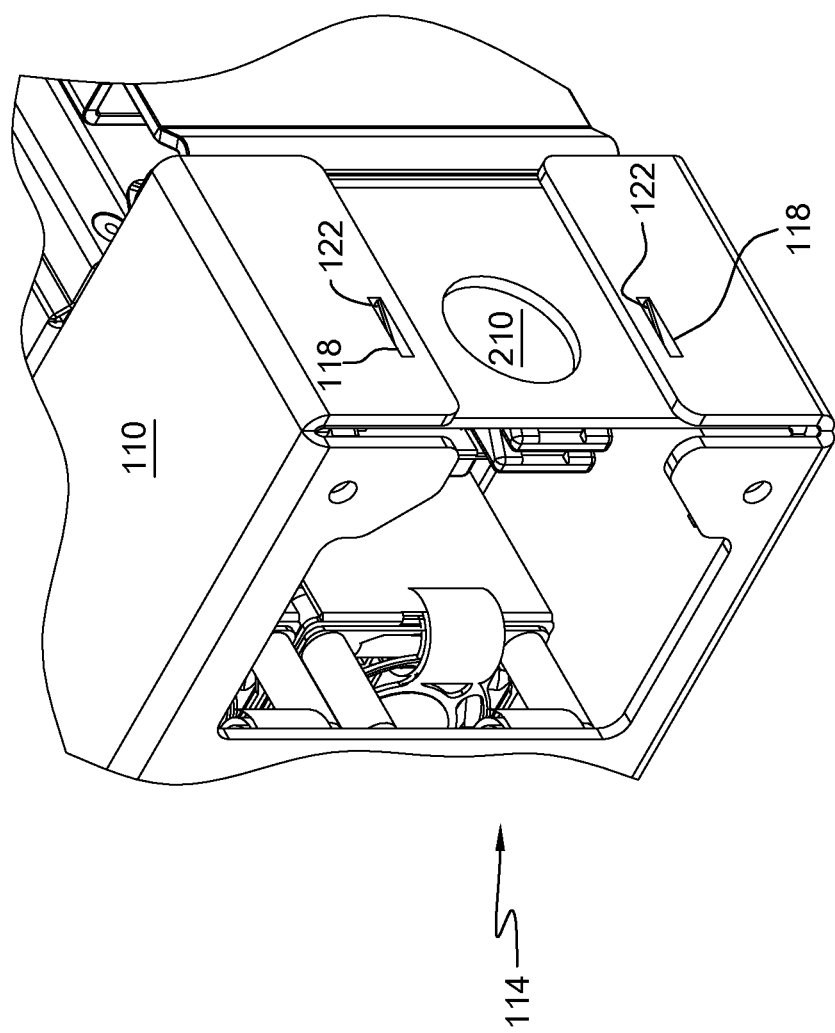
FIG. 4 is a perspective view illustration depicting selected portions of one example of a strengthening bracket, included in the embodiment of FIGS. 1A and 1B, and in accordance with one or more embodiments disclosed herein.

FIG. 4 is a perspective view illustration depicting selected portions of one example of the strengthening bracket 110 in accordance with one or more embodiments of the present invention. Referring now to FIG. 4, while continuing to refer to FIG. 1, the depicted strengthening bracket 110 includes an access aperture 114 that enables access to a portion the server 150. For example, the access aperture 114 may be used to install cable connections used by the server 150.

FIG. 4 also shows the right C-Shaped end of the strengthening bracket 110 after it has been fully installed and engaged/retained by the cantilever spring latch. As previously explained, the protrusions 122 snap into place and protrude through the slots 118 in the C-Shaped end of the strengthening bracket 110 thereby coupling the strengthening bracket 110 to the equipment case 130. Once engaged, the protrusions 122 and flexing members 210 retain the bracket in place and prevent unintentional disengagement from the equipment case 130 (e.g., during shipping, earthquakes, or accidents). To remove the strengthening bracket 110, the flexing member 210 is deflected via the release aperture 220. In response thereto, the protrusions 122 retract from the slots 118 and enable removal of the strengthening bracket 110.

Figure 5:
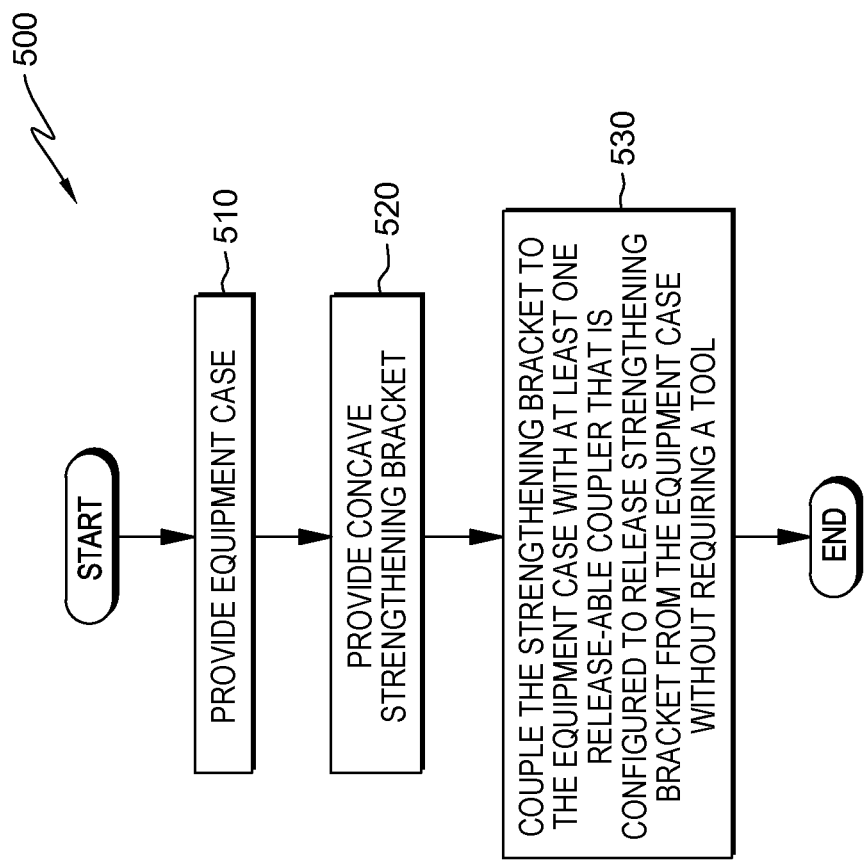
FIG. 5 is a flowchart depicting one example of an equipment strengthening method in accordance with one or more embodiments disclosed herein.

FIG. 5 is a flowchart depicting one example of an equipment strengthening method 500 in accordance with one or more embodiments of the present invention. As depicted, the equipment strengthening method 500 includes providing (510) an equipment case, providing (520) a strengthening bracket, and coupling (530) the strengthening bracket to the equipment case. The equipment strengthening method 500 strengthens equipment while enabling tool-less removal of the strengthening bracket in order to service the equipment.

Providing (510) an equipment case may include providing equipment that is packaged in a case. Examples of such equipment includes computers, servers, storage devices and storage arrays, audio equipment, video equipment, or other types of electronic equipment. Oftentimes, such equipment is rack mountable and may be mounted in a rack previous to transport and installation. However, the cases for such equipment may not be engineered to withstand the shocks involved with many forms of transport—particularly over long distance.

Providing (520) a strengthening bracket may include providing a bracket that is engineered to provide strength to an equipment case. The equipment case may encase equipment such as blade servers and storage arrays. The strengthening bracket may have a concave shape that increases strength. The strengthening bracket may also be meshed in order to reduce weight and enable airflow.

Coupling (530) the strengthening bracket to the equipment case may include coupling the strengthening bracket to the equipment case with one or more releasable couplers that enable releasing the strengthening bracket from the equipment case without requiring a tool. Releasing the strengthening bracket may enable a technician to service the equipment while mounted in a rack or the like. Subsequently, the strengthening bracket may be re-coupled to the equipment case.

One of skill in the art will appreciate that the embodiments disclosed herein provide additional strength to an equipment case both during shipping and continued operation while enabling service personnel to service the equipment via tool-less removal of a strengthening bracket. Additionally, the embodiments disclosed herein are able to effectively strengthen, and/or stiffen, an equipment case to withstand stresses and shocks that are beyond normal operational requirements so that the equipment stored therein is protected from earthquakes and other disasters.

Some possible variations to the embodiment of FIGS. 1A and 1B will now be discussed with reference to FIGS. 1A and 1B. For this discussion of alternative embodiments, it is helpful to think of the equipment strengthening assembly as potentially including for sub-assemblies as follows: (i) a component sub-assembly (which, in the embodiment of FIGS. 1A and 1B includes server 150, equipment case 130 and slideout arms 141); (ii) a rack mount housing sub-assembly (which, in the embodiment of FIGS. 1A and 1B includes an outer shell (not shown in the drawings, but familiar to those of skill in the art), left and right side rack mount posts (not shown in the drawings, but familiar to those of skill in the art) and slideout arm engagement hardware 142); (iii) bracket sub-assembly (which, in the embodiment of FIGS. 1A and 1B includes strengthening bracket 110); and (iv) intermediate coupling sub-assembly (which, in the embodiment of FIGS. 1A and 1B includes couplers 120, protrusions 122 and flexing members 210). For the following discussion of variations and alternative embodiments, it is also helpful to understand that the construction and layout of the rack mount housing sub-assembly and/or the component sub-assembly will define the following dimensions: up/down; left side/right side; and front/back.

In some embodiments, the rack mount housing sub-assembly may be omitted.

In some embodiments, the functionality of that intermediate coupling sub-assembly (that is, tool-less releasable engagement of the bracket sub-assembly to the main assembly) may be built into the component sub-assembly and/or the bracket sub-assembly, rather than being a separate sub-assembly.

In the embodiment of FIGS. 1A and 1B, the component sub-assembly includes slidable arms. Alternatively, the component sub-assembly may not include slidable arms (for example, the bracket sub-assembly may releasably mechanically connect to the equipment casing. In the embodiment of FIGS. 1A and 1B, the component sub-assembly slides in the front/back direction with respect to the rack mount housing sub-assembly. Alternatively, the component sub-assembly may be fixedly mechanically connected to the rack mount housing sub-assembly. As a further alternative, the hardware mechanically connecting the component sub-assembly to the rack mount housing sub-assembly may provide for other types of relative motion between the rack mount housing sub-assembly and the component sub-assembly.

In the embodiment of FIGS. 1A and 1B, the bracket sub-assembly is releasably attached across: (i) the left side/right side dimension of the component sub-assembly; and (ii) the up/down dimension of the component sub-assembly. That means that, in that embodiment, the bracket sub-assembly enhances stiffness with respect to both the side-to-side direction and the up-and-down direction. In the embodiment of FIGS. 1A and 1B, the side-to-side stiffening enhancement is probably most important because the component sub-assembly is elongated in the side-to-side direction. Alternatively or additionally, in the case of an especially tall component sub-assembly, the up/down dimension stiffening may take on more practical importance. Generally speaking, in various embodiments of the present disclosure, the bracket sub-assembly will be connected across and will provide enhanced stiffness in at least one of the following directions: (i) side-to-side; (ii) up/down; and/or (iii) front/back.

In the embodiment of FIGS. 1A and 1B, the stiffening bracket is releasably mechanically connected, through intermediate coupling sub-assembly, to the component sub-assembly. Alternatively, the bracket sub-assembly could be alternatively, or additionally, be releasably mechanically connected to the rack mount housing sub-assembly (for example, to mounting rails (not shown in the Figures) in the rack mount housing sub-assembly). This tool-lessly-releasable mechanical connection between the bracket sub-assembly and the rack mount housing sub-assembly ma, or may not, employ an intermediate coupling sub-assembly.

Whether the bracket sub-assembly is mechanically connected to the component sub-assembly, the rack mount housing sub-assembly, or both, the connection may not entirely rigid with respect to all directions. For example, a side-to-side stiffening bracket sub-assembly may be mechanically connected to have some "play" in the up/down and/or front/back dimensions with respect to the sub-assembly(ies) to which the bracket sub-assembly is connected.

In the embodiment of FIGS. 1A and 1B, the bracket enhances damage resistance primarily through a relatively stiff, relatively inelastic bracket that can absorb significant stresses with little strain and no failure. Alternatively, the bracket may be partially, or wholly, made of more elastic material so that stresses are absorbed by strain in the elastic material, which recovers its shape when the stress stops.

In the embodiment of FIGS. 1A and 1B, the bracket sub-assembly is located behind the rear end of the component sub-assembly. Alternatively or additionally, the bracket sub-assembly could be located over any exterior surface, side or end of the component sub-assembly. Of course, the side of the component sub-assembly over which the bracket sub-assembly extends will largely determine the directions of stiffening of strengthening. For example, if the bracket sub-assembly extends from the front end of the left side surface of the component sub-assembly to the back end of the left side surface of the component sub-assembly, then it will tend to strengthen against: (i) compressive tensile stress applied in the front/back direction in the vicinity of the left side; and (ii) up/down stresses in the vicinity of the left side (especially if the bracket has a substantial up/down direction height).

The embodiment of FIGS. 1A and 1B uses hand operable, spring loaded latch hardware to effect the tool-less releasability of the bracket sub-assembly. Alternatively or additionally, other types of tool-lessly releasable mechanical connection hardware may be used, such as the following: friction or force fit; hand operated threadable engagement hardware (for example, a hand operable screw); magnetic connector (for example, a solenoid mechanical latch); etc.

One of skill in the art will appreciate that a variety of adjustments may be made to the depicted embodiments that fit within the spirit and intent of the claimed invention. Consequently, it should be noted that this description is not intended to limit the invention. On the contrary, the embodiments presented are intended to cover some of the alternatives, modifications, and equivalents, which are included in the spirit and scope of the invention as defined by the appended claims. Further, in the detailed description of the disclosed embodiments, numerous specific details are set forth in order to provide a comprehensive understanding of the claimed invention. However, one skilled in the art would understand that various embodiments may be practiced without such specific details.

Although the features and elements of the embodiments disclosed herein are described in particular combinations, each feature or element can be used alone without the other features and elements of the embodiments or in various combinations with or without other features and elements disclosed herein.

This written description uses examples of the subject matter disclosed to enable any person skilled in the art to practice the same, including making and using any devices or systems and performing any incorporated methods. The patentable scope of the subject matter is defined by the claims, and may include other examples that occur to those skilled in the art. Such other examples are intended to be within the scope of the claims.

What is claimed is:

1. A system comprising:
an equipment case configured to hold equipment;
a strengthening bracket;
at least one releasable coupler physically coupled to the equipment case and the strengthening bracket, the at least one releasable coupler configured to release the strengthening bracket from the equipment case without requiring a tool;
wherein the strengthening bracket comprises a first end and a second end;
wherein the at least one releasable coupler comprises a first and a second releasable coupler for release-ably coupling to the first end and the second end respectively;
wherein the first and second releasable couplers each comprise a flexing member disposed on an inner side of the respective releasable coupler and provided with a barbed protrusion member that protrudes through a slot in the respective releasable coupler;

wherein the first end and the second end of the strengthening bracket each comprise a slot for receiving the respective barbed protrusion member;

wherein the first and second releasable couplers each comprise apertures that align with release apertures disposed at each end of the strengthening bracket;

wherein the apertures and the release apertures enable a user to insert a digit through the respective releasable coupler and press against the flexing member disposed on the inner side of the respective releasable coupler;

wherein the at least one releasable coupler is physically coupled to the equipment case via one or more fasteners;

wherein the strengthening bracket comprises an access aperture for installing cable connections to the equipment; and wherein the strengthening bracket comprises a meshed metal material.

* * * * *